(12) United States Patent
Van Lunteren et al.

(10) Patent No.: US 10,740,116 B2
(45) Date of Patent: Aug. 11, 2020

(54) THREE-DIMENSIONAL CHIP-BASED REGULAR EXPRESSION SCANNER

(71) Applicant: International Business Machines Corporation, Armonk, NY (US)

(72) Inventors: Jan Van Lunteren, Gattikon (CH); James Coghlan, Wappingers Falls, NY (US); Douglas J. Joseph, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 669 days.

(21) Appl. No.: 14/841,825

(22) Filed: Sep. 1, 2015

(65) Prior Publication Data

US 2017/0061304 A1    Mar. 2, 2017

(51) Int. Cl.
*G06F 9/448*    (2018.01)
*G06F 30/34*    (2020.01)
*G06F 30/39*    (2020.01)

(52) U.S. Cl.
CPC .......... *G06F 9/4498* (2018.02); *G06F 30/34* (2020.01); *G06F 30/39* (2020.01)

(58) Field of Classification Search
CPC .................................................. G06F 9/4498
(Continued)

(56) References Cited

U.S. PATENT DOCUMENTS 5,347,491 A * 9/1994 Kagami ............... G11C 11/406
                                                       365/193
6,052,772 A * 4/2000 Kark .................... G06F 13/1605
                                                       711/151

(Continued)

FOREIGN PATENT DOCUMENTS

EP          0390538 A2 * 10/1990 .......... G06F 12/0811

OTHER PUBLICATIONS

Daniel Luchaup, et al., Multi-byte Regular Expression Matching with Speculation (Sep. 2009), Proceedings in Recent Advances in Intrusion Detection 12th International Symposium at 284-303.*
Tran Trung Hieu, Tran Ngoc Thinh, A Memory Efficient FPGA-based Pattern Matching Engine for Stateful NIDS (2013), IEEE 2013 5th International Conference on Ubiquitous and Future Networks at 252-257.*

(Continued)

*Primary Examiner* — Kamran Afshar
*Assistant Examiner* — Benjamin J Buss
(74) *Attorney, Agent, or Firm* — Daniel P. Morris, Esq.; Hoffman & Baron, LLP

(57) ABSTRACT

A method for performing enhanced pattern scanning includes the steps of: providing a three-dimensional memory structure including multiple physical memory elements; compiling multiple programmable finite state machines, each of the programmable finite state machines representing at least one deterministic finite automation data structure, the data structure being distributed over at least a subset of the physical memory elements; configuring a subset of the programmable finite state machines to operate in parallel on a same input data stream, while each of the subset of programmable finite state machines processes a different pattern subset; and providing a local result processor, the local result processor transferring at least a part of a match state from the deterministic finite automation data structures to corresponding registers within the local result processor, the part of the match state being manipulated being based on instructions embedded within the deterministic finite automation data structures.

18 Claims, 9 Drawing Sheets

(58) Field of Classification Search
USPC .......................................... 706/47; 712/300
See application file for complete search history.

(56) References Cited

U.S. PATENT DOCUMENTS

| | | | |
|---|---|---|---|
| 6,167,047 A | 12/2000 | Welfeld | |
| 7,464,254 B2 | 12/2008 | Sharangpani et al. | |
| 8,055,601 B2 | 11/2011 | Pandya | |
| 8,434,087 B2 | 4/2013 | Degenaro et al. | |
| 8,447,749 B2 | 5/2013 | Biran et al. | |
| 2009/0103345 A1* | 4/2009 | McLaren | G11C 5/02 365/64 |
| 2011/0067016 A1* | 3/2011 | Mizrachi | G06F 8/4442 717/149 |
| 2011/0161748 A1* | 6/2011 | Casper | G11C 5/02 714/708 |
| 2011/0307433 A1* | 12/2011 | Dlugosch | G06F 15/17362 706/45 |
| 2012/0127779 A1* | 5/2012 | Scheuerlein | G11C 5/02 365/148 |
| 2012/0203730 A1 | 8/2012 | Biran et al. | |
| 2012/0324462 A1* | 12/2012 | Miljanic | G06F 9/5038 718/103 |
| 2013/0148402 A1* | 6/2013 | Chang | G11C 8/08 365/63 |
| 2013/0275823 A1* | 10/2013 | Cordero | H03K 19/17796 714/718 |
| 2013/0339571 A1* | 12/2013 | Cernea | H01L 27/249 711/102 |
| 2014/0006864 A1* | 1/2014 | Menon | G11C 29/022 714/32 |
| 2014/0172766 A1 | 6/2014 | Van Lunteren | |
| 2014/0297957 A1* | 10/2014 | Aoyagi | G06F 12/0804 711/120 |
| 2015/0378898 A1* | 12/2015 | Busaba | G06F 12/0808 711/130 |
| 2015/0378926 A1* | 12/2015 | Busaba | G06F 12/0891 711/141 |
| 2016/0165730 A1* | 6/2016 | Fu | H01L 25/0657 361/748 |

OTHER PUBLICATIONS

Pawlowski, Hybrid Memory Cube (HMC), Presentation at Hot Chips: Symp. On High Performance Chips (2011) ("Pawlowski") retrieved from Internet <https://www.hotchips.org/wp-content/uploads/hc_archives/hc23/HC23.18.3-memory-FPGA/HC23. 18.320-HybridCube-Pawlowski-Micron.pdf> (Year: 2011).*

Khalifa et al., Memory Controller Architectures: A comparative Study, 2013 8th IEEE Design and Test Symposium (2013), pp. 1-6 (Year: 2013).*

Nair et al., Active Memory Cube: A Processing-in-Memory Architecture for Exascale Systems, (May 2015) IBM J. Res. & Dev. vol. 59, Paper 17 (Year: 2015).*

Fabre, C. et al. (Oct. 2011). "PRO3D: Programming for future 3D Manycore Architectures: Project's interim status." In International Symposium on Formal Methods for Components and Objects (pp. 277-293). Springer, Berlin, Heidelberg. (Year: 2011).*

J. Van Lunteren et al., "Designing a programmable wire-speed regular-expression matching accelerator," Microarchitecture (MICRO), 2012 45th Annual IEEE/ACM International Symposium on, IEEE, 2012. pp. 461-472.

Soewito et al., "Self-addressable memory-based FSM: a scalable intrusion detection engine." Network, IEEE 23.1 (2009), pp. 14-21.

Cho et al., "Programmable hardware for deep packet filtering on a large signature set." First IBM Watson P= ac2 Conference, Yorktown, NY, 2004, pp. 1-10.

J. Van Lunteren, et al., "Regular Expression Acceleration at Multiple Tens of Gb/s," 1st Workshop on Accelerators for High-performance Architectures (WAHA), in conjunction with the 23rd International Conference on Supercomputing (ICS-2009), Yorktown Heights, NY, pp. 1-8, Jun. 2009.

J. Van Lunteren, "High-performance pattern-matching for intrusion detection," IEEE INFOCOM'06, Barcelona, Spain, pp. 1-13, Apr. 2006.

* cited by examiner

THREE-DIMENSIONAL CHIP-BASED REGULAR EXPRESSION SCANNER

STATEMENT OF GOVERNMENT RIGHTS

This invention was made with Government support under Contract No. H98230-12-C-0325 awarded by the Department of Defense. The Government has certain rights in this invention.

BACKGROUND OF THE INVENTION

The present invention relates generally to the electrical, electronic and computer arts, and, more particularly, to pattern scanning and matching for use in high-speed data processing and analytics applications.

Pattern scanning and recognition applications are more and more prevalent across industries today, motivated at least in part by the increased need for security and analytics. Facial recognition is just one small niche in pattern recognition and analysis applications. In a facial recognition application, for example, there is an emerging trend to employ three-dimensional face recognition, which promises improved accuracy; it can also identify a face from a range of viewing angles, including a profile view. However, such improved accuracy, as well as enhanced analytics, comes at the expense of significantly increased amounts of data to be processed at increasingly higher rates of speed. Modern pattern scanners and scanning architectures are not capable of achieving the scan rates (e.g., terabits/second) necessary to support the hundreds of thousands to millions of patterns and millions of active scan sessions used in advanced pattern scanning and recognition applications.

BRIEF SUMMARY

Principles of the present invention, in accordance with one or more embodiments thereof, provide a pattern scanner and scanning architecture capable of achieving scan rates of a terabit/second and beyond while also supporting hundreds of thousands to millions of patterns and millions of active scan sessions. To accomplish this, aspects of the invention exploit the use of a three-dimensional (3D) memory structure configured to provide increased bandwidth compared to conventional memory. Additionally, one or more embodiments include a local result processor implemented in a distributed fashion and integrated with the 3D memory.

In one aspect, an exemplary method for performing enhanced pattern scanning includes the steps of: providing a three-dimensional memory structure including multiple physical memory elements; compiling multiple programmable finite state machines, each of the programmable finite state machines representing at least one deterministic finite automation data structure, the data structure being distributed over at least a subset of the physical memory elements; configuring a subset of the programmable finite state machines to operate in parallel on a same input data stream, while each of the subset of programmable finite state machines processes a different pattern subset; and providing a local result processor, the local result processor transferring at least a part of a match state from the deterministic finite automation data structures to corresponding registers within the local result processor, the part of the match state being manipulated being based on instructions embedded within the deterministic finite automation data structures.

In another aspect, an exemplary pattern scanning apparatus includes a three-dimensional memory structure including multiple physical memory elements, multiple programmable finite state machines, and at least one local result processor. Each of the programmable finite state machines is adapted to receive an input data stream and represents at least one deterministic finite automation data structure, the data structure being distributed across at least a subset of the physical memory elements. The local result processor includes multiple processing units distributed across at least the subset of the physical memory elements, the local result processor being configured to transfer at least a part of a match state from the deterministic finite automation data structures to corresponding registers within the local result processor, the part of the match state being manipulated based on instructions embedded within the deterministic finite automation data structures. The pattern scanning apparatus further including a match report function module configured to generate a match output, the match output identifying a prescribed pattern in the input data stream detected as a function of state information obtained from the programmable finite state machines.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. By way of example only and without limitation, one or more embodiments of the invention may provide one or more of the following advantages:

efficient multi-session support for millions of active scan sessions on different data streams;

multiple dedicated physical scan engines, with each scan engine operating essentially independently on a same data stream to facilitate processing in a distributed manner to obtain more flexibility while achieving higher scan rates by improving the utilization of the available memory bandwidth;

fast local result processing implemented in a distributed manner using small processing elements that are integrated into the memory system, thereby enabling more efficient use of the available bandwidth resulting in higher scan performance.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1A:
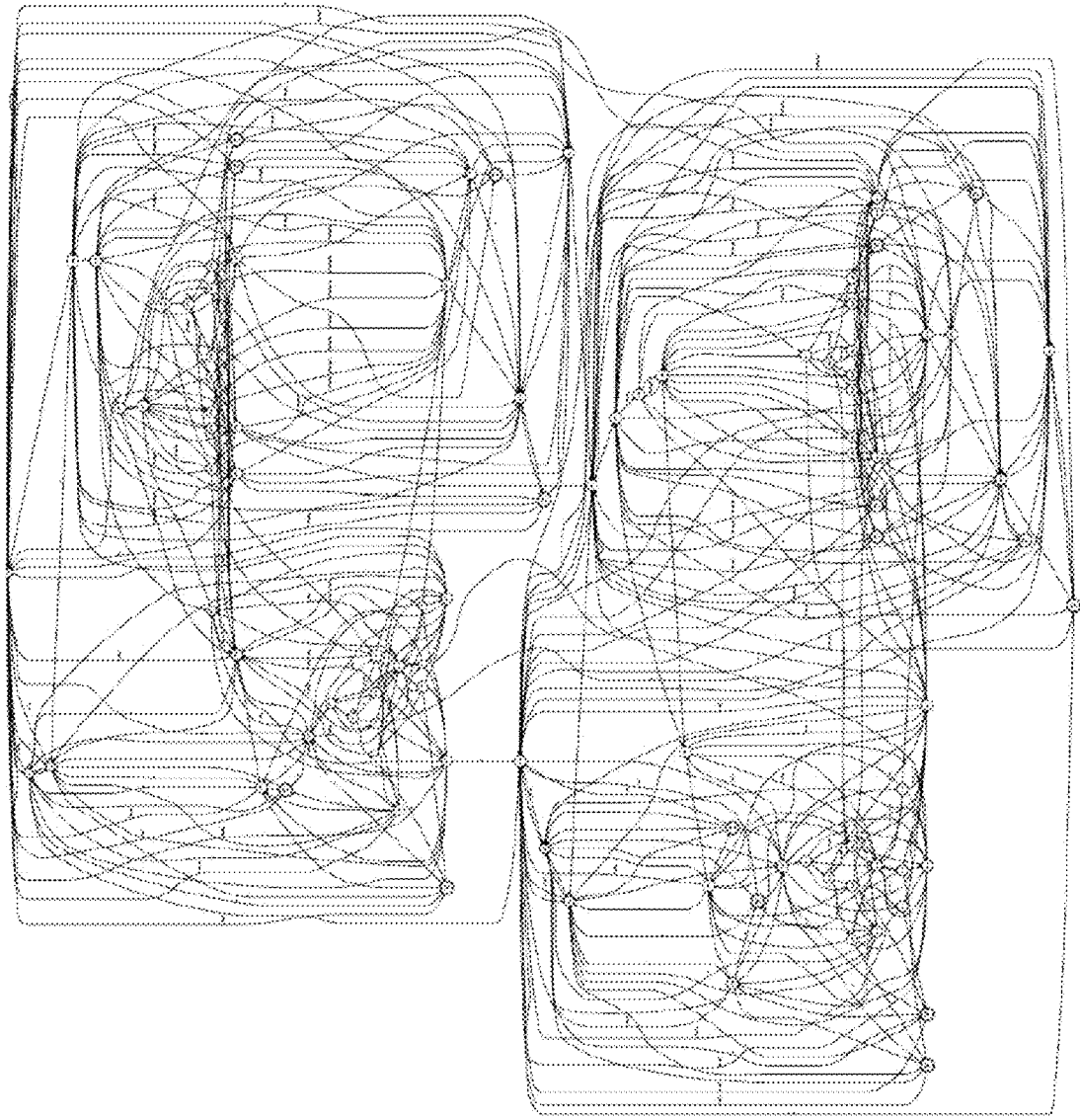
FIG. 1(a) is an illustration of deterministic finite automata (DFA) generated by standard algorithms.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments of a computing system and method for enhanced pattern scanning and recognition. It is to be appreciated, however, that the invention is not limited to the specific apparatus and/or methods illustratively shown and described herein. Moreover, it will become apparent to those skilled in the art given the teachings herein that numerous modifications can be made to the embodiments shown that are within the scope of the claimed invention. Thus, no limitations with respect to the embodiments shown and described herein are intended or should be inferred.

As previously stated, the pattern scanner and scanning architecture according to embodiments of the present invention exploits the vast memory bandwidth available in a 3D chip structure comprising multiple layers of memory (e.g., embedded dynamic random-access memory (eDRAM)) to achieve scan rates of a terabits/sec and beyond while supporting hundreds of thousands to millions of patterns and millions of active scan sessions. In addition to employing the pattern scanner for security-related applications (e.g., intrusion detection), embodiments of the invention can be used for large scale analytics, wherein the scanner would be used for scanning large amounts of data and compared against huge keyword dictionaries.

A pattern scanner according to one or more embodiments comprises a combination of fast programmable finite state machines (FSMs), called B-FSMs, and small post-processing units, denoted as local result processors (LRPs). While these components have also been used to design a regular expression accelerator as part of an IBM processor, this regular expression accelerator is able to scan input streams at rates between about 20 and 40 Gbits/s for typical network intrusion detection workloads involving up to a few thousand patterns. A standard processor architecture is not able to support, nor could it be scaled to support, scan rate and pattern count objectives of modern systems that are multiple orders of magnitude larger. As a result, new mechanisms are required to be used in the scanner of the present invention for overcoming scaling problems and for realizing more aggressive performance targets. One or more of these new mechanisms involve the incorporation of a 3D chip architecture and memory system which is fundamentally different from a two-layer memory hierarchy utilized in a conventional engine; that is, one benefit according to one or more embodiments of the invention is the novel way in which the BFSMs and the LRPs are implemented in a distributed fashion in a 3D structure.

In an illustrative intrusion detection context, the number of regular expressions and scan rates targeted by embodiments of the present invention is well beyond the numbers involved in typical state-of-the-art virus/intrusion detection workloads. However, the current trend of increasing the number of patterns for standard intrusion detection workloads to keep up with the fast-growing number of new viruses and intrusions (i.e., attacks), combined with the expectation that 3D chips structures will become more prevalent and less costly in the near future, will drive increased demand for solutions like that presented by one or more embodiments of the present invention.

Most of the work on regular-expression matching is either based on non-deterministic finite automata (NFA) or deterministic finite automata (DFA). One advantage of DFA compared with NFA is a lower processing complexity, which makes DFA more suitable for hardware implementations. For at least this reason, a scanner in accordance with one or more embodiments of the present invention is also based on DFA. One disadvantage of DFA, however, is the storage requirement, which can be substantially larger than the storage requirements of NFA and can result in a "state explosion" when certain combinations of patterns are mapped onto the same DFA. Although no de facto solution exists that completely eliminates the latter problem, a multitude of approaches have been developed that target the high storage costs of DFA.

In the design of one or more embodiments of the present invention, data storage efficiency is improved in at least three ways. First, a B-FSM engine provides one of the most compact representations of a given DFA compared to other approaches. It does so, in one embodiment, by directly supporting regular-expression features such as character classes, negation, and case-sensitivity in hardware. A discussion of some of these regular-expression features can be found, for example, in the paper J. van Lunteren, et al., "Regular Expression Acceleration at Multiple Tens of Gb/s," 1st Workshop on Accelerators for High-performance Architectures (WAHA), in conjunction with the 23$^{rd}$ International Conference on Supercomputing (ICS-2009), Yorktown Heights, N.Y., pp. 1-8, June 2009 (hereinafter "Van Lunteren 2009"), the disclosure of which is incorporated herein by reference in its entirety.

Second, in order to reduce the size of DFA (which may be expressed by the number of states and transitions), multiple B-FSMs can operate in parallel on the same input data stream, while each of these B-FSMs can process a different pattern subset. This allows a compiler to separate problematic pattern combinations that would otherwise result in a state explosion, and map these on disjoint DFAs that are executed by different B-FSMs. However, this will result in a reduction in total DFA size that comes at the cost of requiring the operation of multiple B-FSMs in parallel, which consumes additional memory bandwidth and involves a larger session state (the trade-off is made by the compiler).

A third approach to mitigate the state explosion problem, according to one or more embodiments, is the use of a local result processor (LRP). This approach is based on transferring part of the match state from the DFA to registers inside the LRP, which is then manipulated based on instructions that are embedded inside the DFA. Using the LRP, individual problematic regular expressions that cause a state explosion can be split into smaller non-problematic sub-patterns that can be scanned more efficiently by the B-FSM engines. Upon detection of these sub-patterns, the LRP will check if these sub-patterns are found in a prescribed order and at a prescribed distance to determine if the original pattern was matched.

By way of example only and without limitation, the following description illustrates these concepts using the following three simple regular expressions:

$$ab.*cd \quad (1)$$

$$ef[\char`\^\n]*gh \quad (2)$$

$$k..lm \quad (3)$$

The first pattern (1), ab.*cd, will match if the input stream contains the string ab, followed by the string cd, while there can be zero or more characters of any type in between, as defined by the combination of the dot metasymbol '.' and the Kleene star '*'. The second pattern (2) is similar, except that there are no newline characters (\n) allowed in between the strings ef and gh. The third pattern (3) is also similar, except that there should be exactly two characters of any type between the strings k and lm.

For these illustrative patterns, standard algorithms can be used to generate the DFA shown in FIG. 1(a). This DFA contains about 100 states and 500 transitions, which is very large considering the original three small patterns. This is caused in this case by the '.*', '[^\n]*' and '..' parts of the patterns, which allow a multitude of different overlaps to occur between potentially matching strings, which all have to be covered in the DFA for correct detection. The problem can easily grow worse. For example, increasing the number of dot metasymbols in the third pattern results in even larger DFA sizes. Three dot symbols (k...lm) result in a DFA with about 1000 transitions, while four, five, six, and seven dot symbols require DFA with about 2000, 4000, 8500, 17000 transitions, effectively illustrating the exponential nature of the state explosion problem in this example.

Figure 1B:
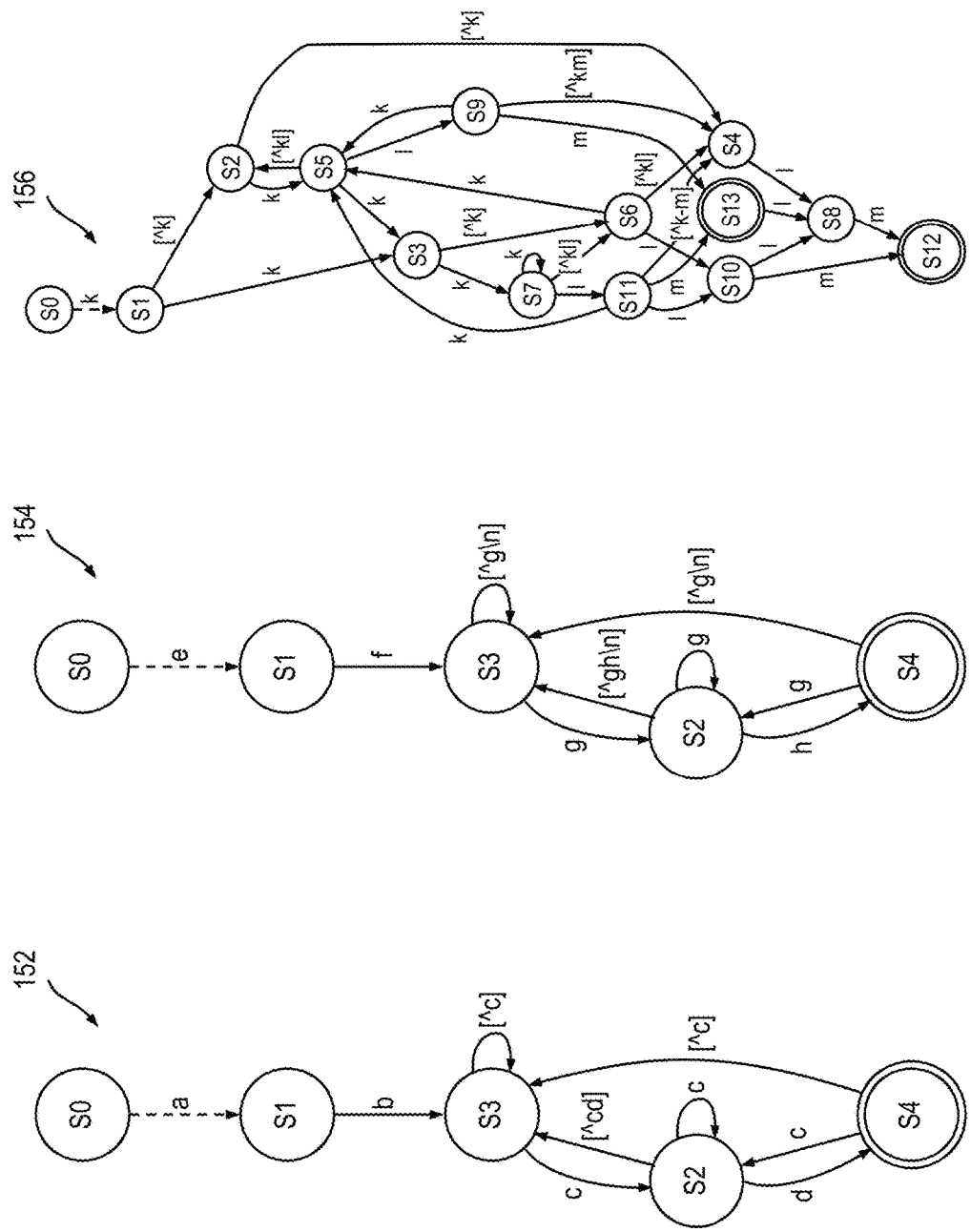
FIG. 1(b) is a conceptual depiction of an exemplary application of three separate DFAs executed on different fast programmable finite state machines (B-FSMs)
Figure 1C:
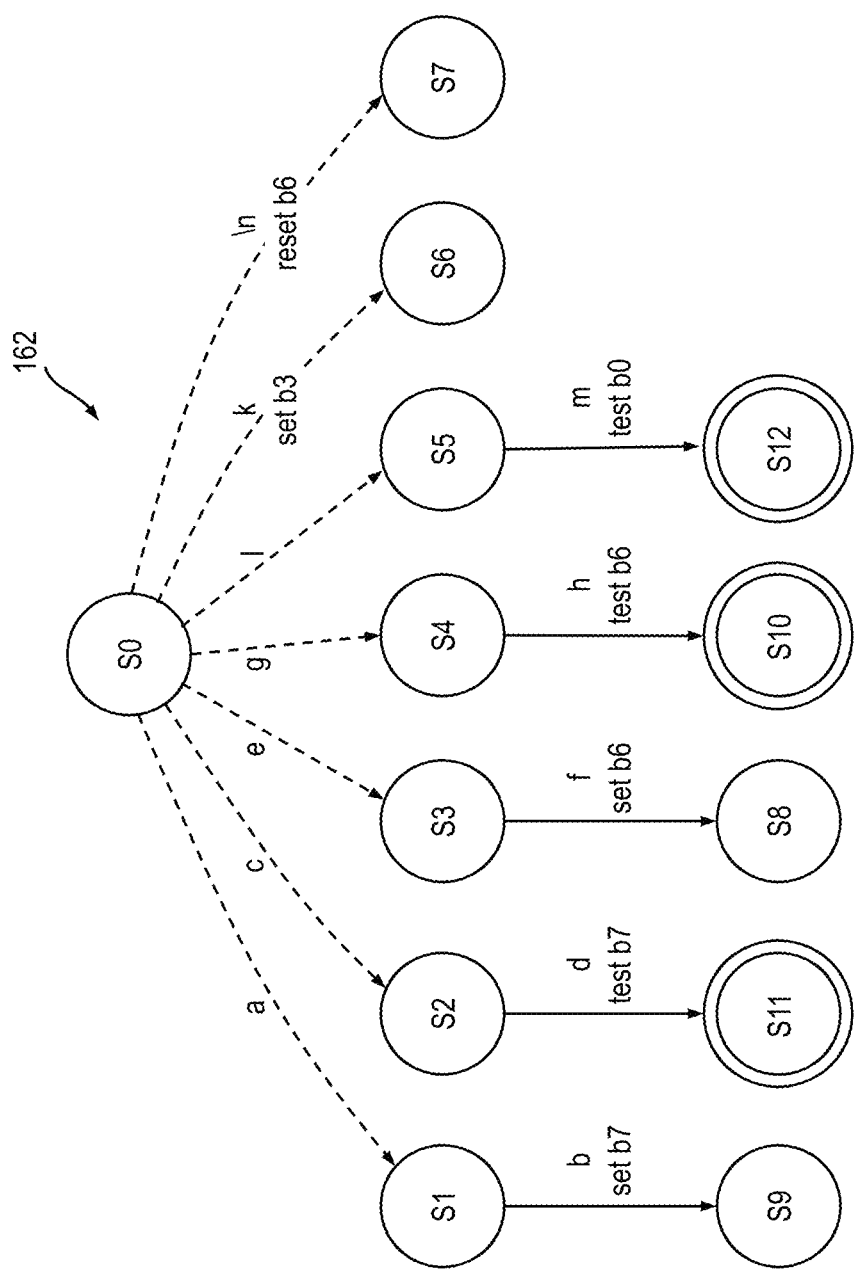
FIG. 1(c) is an illustration with application of a local result processor (LRP)

FIG. 1(b) depicts exemplary state transition diagrams if the three patterns are compiled into three separate DFA, 152, 154 and 156 that are executed on different B-FSMs. In this case, the three DFA 152, 154, 156 include a total of 46 transitions. FIG. 1(c) depicts an exemplary state transition diagram 162 for the case when an LRP is used. In this case, the original patterns are split into sub-patterns ab, cd, ef, gh, k, lm and \n (newline) that are scanned by a single DFA in FIG. 1(c). This DFA is extended with several LRP instructions operating on an internal LRP register (not explicitly shown, but implied) to allow detecting matches on the original patterns. If, for example, a match on ab is detected, then the corresponding transition from state S1 to S9 will result in a set instruction on bit 7 (b7). If a string cd is detected at a later stage (transition from state S2 to S11), then a test instruction is performed on the same bit (b7). A positive test result would then imply that the string ab was already found before and that a match is detected on the pattern ab.*cd.

The LRP is used in a similar way to check for matches against the pattern ef[^\n]*gh, now involving a set and test operation on register bit 6 (b6). The only difference is that newline characters are not allowed to occur between the two sub-patterns, as represented by [^\n]*. For this purpose, a default instruction (attached to the default rule from state S0 to S7—see, e.g., J. van Lunteren, "High-performance pattern-matching for intrusion detection," IEEE INFOCOM'06, Barcelona, Spain, pp. 1-13, April 2006 (hereinafter "Van Lunteren 2006"), the disclosure of which is incorporated herein by reference in its entirety) is applied to reset bit 6 each time a newline character occurs in the input stream. As a result, bit 6 will equal one only if the first sub-pattern ef was detected in the input stream not followed by a newline character. If the second sub-pattern gh is found, then a positive test on bit 6 (transition from state S4 to S10) indicates a match on the original pattern ef[^\n]*gh.

By comparing FIGS. 1(a) and 1(c), it becomes clear that the use of an LRP drastically reduces the size of the original DFA.

The novel 3D-chip-based pattern scanner architecture, according to one or more embodiments, includes one or more of the following beneficial aspects:

A compiled (B-FSM) DFA data structure with integrated instructions that is distributed over dedicated static random-access memory (SRAM) in a field-programmable gate array (FPGA) logic layer and over eDRAM clusters at the eDRAM array layers, which are interconnected by through-silicon vias (TSVs).

A local result processor function that is implemented in a distributed fashion using small processing elements (memory processor units—MPUs) that are integrated into the memory system, and that execute LRP instructions dispatched by the B-FSM array implemented at the FPGA logic layer. This enables fast local processing, saving more bandwidth for the regular B-FSM processing. This function operates on LRP data vectors (one for each active data stream) that are stored in the memory system, and can grow very large (e.g., 1 Mbit compared to only 128 bits in existing engines). An optional instruction-vector recoding module/step in a dispatcher module enables adaptation of the encoding of LRP instructions integrated into the B-FSM data structures to the available vector width and supported subset of MPU instructions, while the recoded instruction vectors can be adapted to efficiently fit the access/transfer data unit over the TSVs to the MPU units.

Various mechanisms enable the B-FSM engines to operate, to a large extent, independently of one another on the same data stream. These include independent input buffer operation for which read pointers are independently controlled by the B-FSMs, and LRP instruction synchronization schemes. An objective here is, again, to enable a more efficient utilization of the available memory bandwidth.

Multi-session support supporting millions of active scan sessions on different data streams, that are processed in an interleaved fashion by storing and retrieving the session state for a given data stream inside the eDRAM array layers. This session state consists of the state of the B-FSM engines involved in the scan operation, the read pointer used to fetch the next input byte (for each B-FSM engine) and the LRP data vector corresponding to that session, including a pointer in the instruction dispatcher to direct the instructions to the right MPU/eDRAM controller. Because the LRP data vector is already stored inside the eDRAM layers, it typically does not need to be stored and retrieved, except for combinations of very large session states and very large numbers of active session for which part of the session state might have to be stored in external memory.

Figure 2:
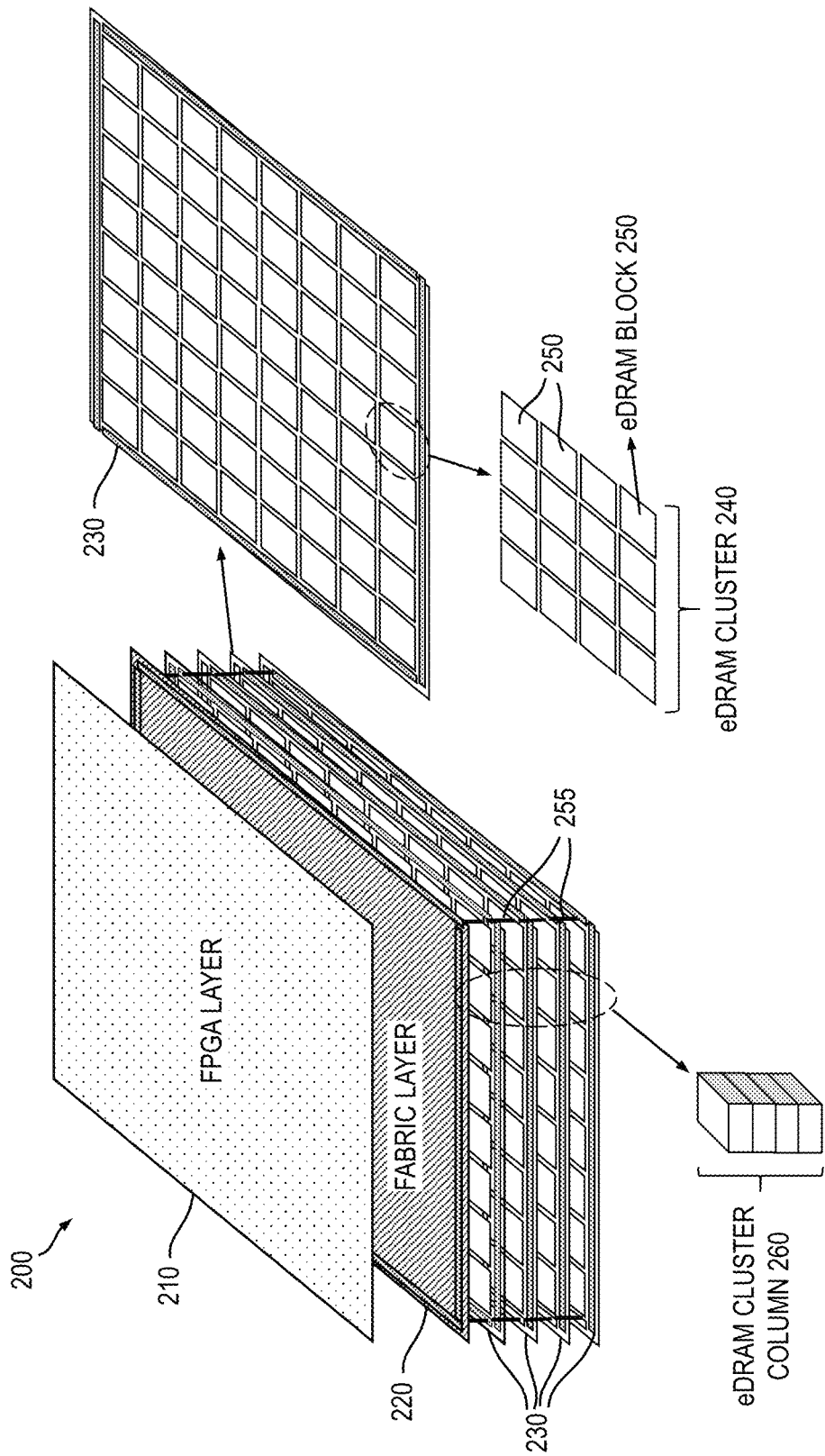
FIG. 2 conceptually depicts at least a portion of an exemplary three-dimensional (3D) chip architecture, according to an embodiment of the invention.

By way of illustration only and without limitation, FIG. 2 depicts at least a portion of an exemplary 3D chip architecture 200, according to an embodiment of the invention. The 3D chip architecture 200 includes an FPGA logic layer 210, a fabric layer 220 with input/output (I/O) macros, and four memory array layers 230. It is to be appreciated that embodiments of the invention are not limited to any particular number or organization of memory array layers. The fabric layer 220 preferably includes high-speed communication links. The memory layers 230, in this illustrative embodiment, each comprise a two-dimensional array of eDRAM clusters 240, with each eDRAM cluster containing one or multiple eDRAM blocks 250 and having its own cluster controller. In this example, each memory array layer 230 contains 8×8=64 eDRAM clusters 240, which each contain 4×4=16 eDRAM blocks 250. eDRAM clusters 240 covering all four memory layers 230 are vertically linked together by TSVs 255 to form so called cluster columns 260. Each cluster column 260 is accessed, in one or more embodiments, using a special interface over a TSV 255. It is to be appreciated that the invention is not limited to any specific size and/or organization of the memory. The logic in the FPGA logic layer 210 that is "on top" of an eDRAM cluster column 260 (i.e., that it is connected to the eDRAM cluster column using TSVs 255) is denoted as the FPGA segment corresponding to that cluster column.

Figure 3:
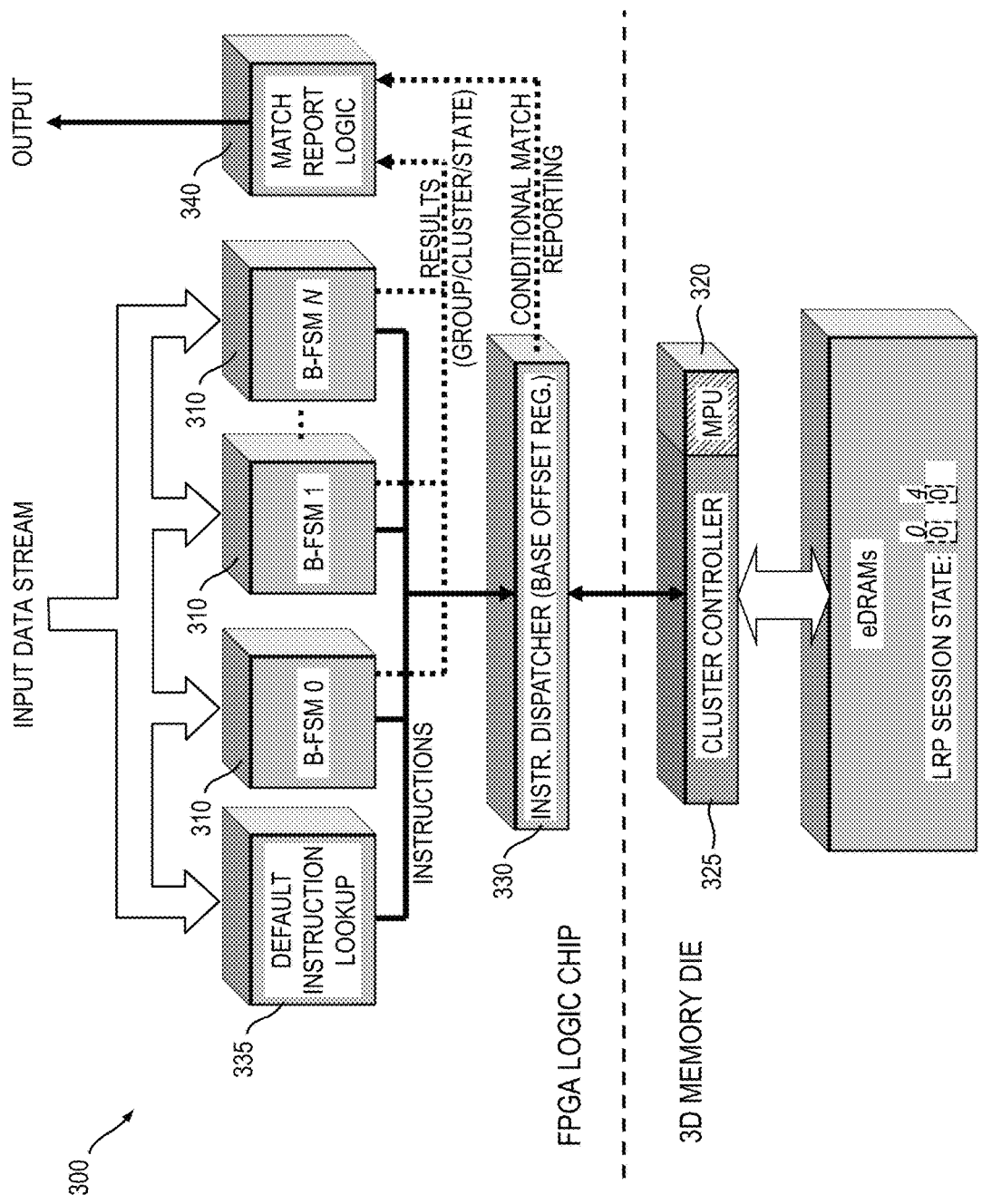
FIG. 3 is a high level block diagram showing primary scanner components operative to scan an input data stream, according to an embodiment of the invention.

FIG. 3 is a high-level block diagram illustrating at least a portion of an exemplary scanner 300, according to an embodiment of the invention. As apparent from FIG. 3, an input data stream (INPUT) is fed to (N+1) B-FSM engines or modules 310, where N is an integer, configured to scan the data supplied by the input data stream based on DFA that are compiled separately for each B-FSM engine. In one or more embodiments, the B-FSM engines 310 are implemented in the FPGA logic chip. The compiled DFA data structures are stored in the eDRAMs that are part of the cluster columns corresponding to the segments implementing the B-FSM engines 310. The B-FSM engines 310 access transition rules that constitute those DFA data structures, through the connecting TSVs (not explicitly shown in FIG. 3, but implied).

The new LRP is implemented, in one or more embodiments, in a distributed fashion by multiple processing units integrated into the memory array layers in FIG. 2. The LRP does not contain a register file as with the concept applied in other designs, but operates directly on data vectors stored in the eDRAM layers and that are allocated to a given input stream (these data vectors are denoted as LRP session state in FIG. 3). The actual processing (e.g., condition testing and bit/data manipulations) is performed by memory processor units (MPUs) 320 which reside in the eDRAM cluster controllers 325. Instructions are sent by the B-FSM engines 310 to the MPUs 320 through an instruction dispatcher module 330 that forwards those instructions using special types of memory accesses (e.g., read, write, read-modify-write).

Upon detection of a match, data is sent back by an MPU 320 to a match report function module 340 residing on the FPGA logic chip. The match report function module 340 is configured to prepare a match record (OUTPUT) which is sent to the scan application. The match record identifies the prescribed pattern detected using state information from the B-FSM engines 310 and can include additional data, such as, for example, immediate values from the LRP instruction or data retrieved from the LRP session state, that can be used for further processing in software or hardware.

Note, that it is preferable for storage efficiency reasons to perform a recoding step on the instructions, which may be implemented by a recoding module (not explicitly shown, but implied) residing within the instruction dispatcher module 330. In this way, the LRP instruction vectors attached to the transitions in the B-FSM data structure can be encoded to efficiently fit the available instruction vector widths in that data structure, while also taking into account the number and type of instructions that are used for this purpose. In one or more embodiments, these instruction vectors are then recoded by the instruction dispatcher module 330 into a format that fits the transfer/access size and execution of those instructions over the TSVs and the way these instruction vectors are handled by the MPUs in the cluster controller 325. In this way, the MPUs 320 can implement a much larger instruction set that is more general purpose and can serve other applications as well, while the LRP instruction vectors inside the B-FSM data structures will essentially only encode the subset of MPU instructions that are actually used for the LRP processing.

A default rule mechanism that is part of the B-FSM concept is implemented using a default instruction lookup module 335 that includes a dedicated SRAM for this purpose that is shared among multiple B-FSMs, according to one or more embodiments. The default instruction lookup module 335 also allows default instructions to be attached to those default rules that are processed in a similar fashion as described above. The components shown in FIG. 3 may be replicated multiple times within the FPGA logic layer. In one or more embodiments, all or at least a subset of cluster controllers 325 in the eDRAM array chips preferably contain MPUs 320. This arrangement makes it possible to scan a large number of data streams in parallel and in an interleaved fashion, which in turn makes it possible to efficiently exploit the available memory bandwidth of the eDRAM array chips.

Figure 4:
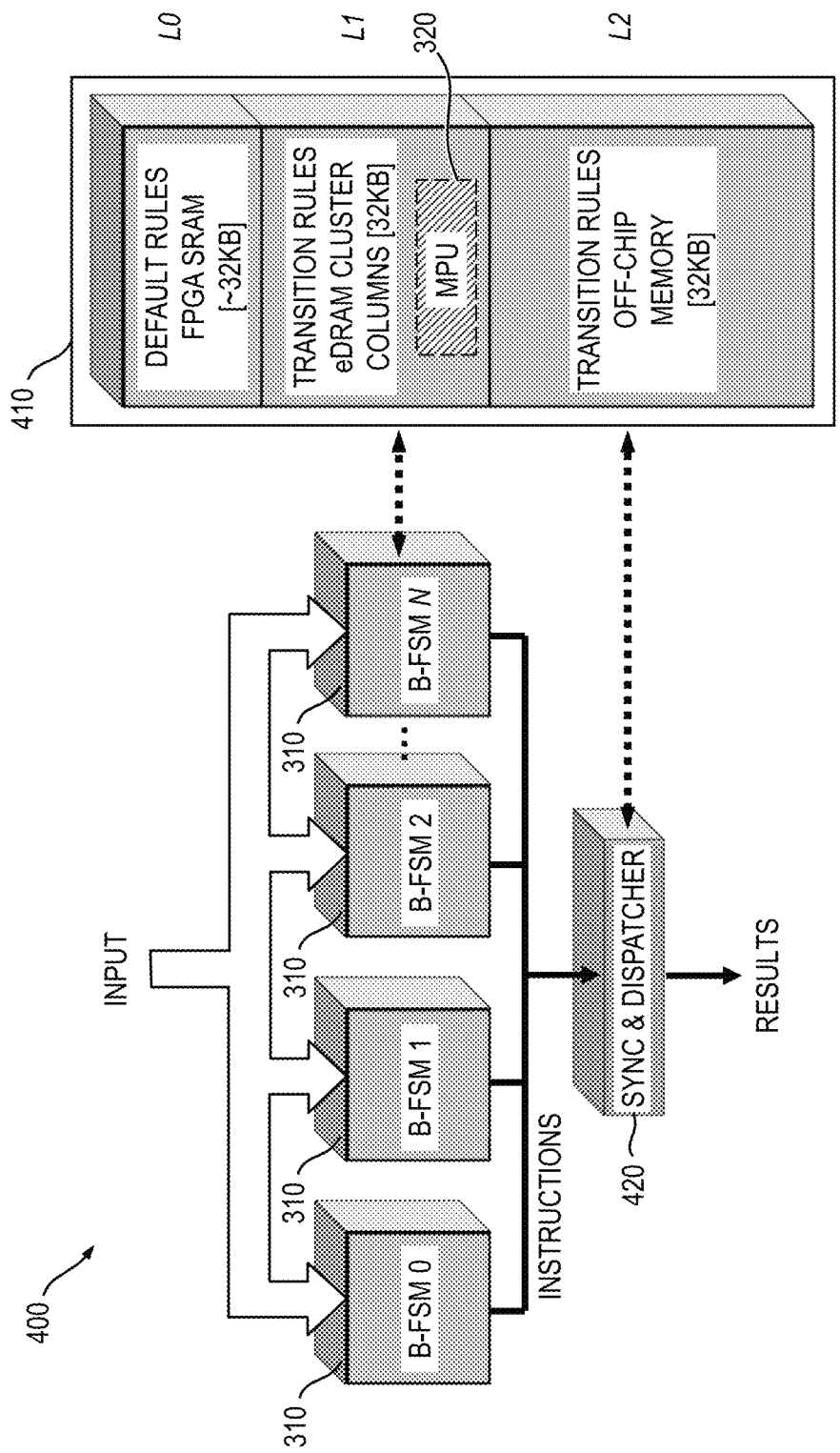
FIG. 4 is a block diagram depicting an off-chip memory useful in conjunction with one or more embodiments and/or elements of the invention.

For data structures that are too large to fit completely within the eDRAM array chips, a large off-chip memory can be used as a next level in the memory hierarchy. This is illustrated in FIG. 4, which depicts at least a portion of an exemplary scanner 400, according to another embodiment of the invention. The pattern scanner 400 in this embodiment includes a 3-layer memory hierarchy 410 that is used by the B-FSMs 310. In this case, the top level L0 is comprised of the SRAMs at the FPGA logic layer that are used to store the default rules, the next level L1 is comprised of the eDRAM cluster columns, and the third level L2 consists of the off-chip memory. Note that the sizes of the various memory levels are not fixed but only listed as an exemplary indication of the order of magnitude.

Another way of improving memory bandwidth utilization is to let the B-FSM engines that process the same input stream, operate as independently as possible from each other. In this embodiment, a larger number of memory accesses is performed per unit of time, because B-FSM engines are put on hold fewer times (e.g., to wait for another B-FSM that is lagging behind), which would be the case with other engines in which all B-FSMs are operated in a kind of lockstep fashion. Realizing this embodiment involves two functions: 1) The B-FSMs should be able to operate independently on the input buffer so that they can fetch the input data independently of the processing speed of the other B-FSMs; and 2) a synchronization scheme is used for LRP instructions dispatched by different B-FSMs, in order to prevent race conditions that impact the correctness of the LRP processing results. The synchronization scheme is implemented by a synchronization and dispatcher module 420 in the pattern scanner, according to one or more embodiments. These mechanisms are further described herein below. In accordance with an alternative embodiment, a basic architecture can be designed involving only the distribution of the B-FSMs/LRPs over the 3D structure including the MPUs.

Independent B-FSM Operation

One important aspect according to one or more embodiments of the invention is the independent reading of the input data by the B-FSM engines that are operating on the same input data stream. This is different from other engines in which all B-FSM engines operate in parallel on the same input byte, causing slower B-FSM engines (e.g., due to cache misses) to force the remaining B-FSM engines to go into a hold state until all B-FSM engines can continue the processing of the next input byte in a lockstep fashion. The novel approach, in accordance with aspects of the present disclosure, advantageously involves a separate read pointer into the input buffer for each of the B-FSM engines operating on the same input data stream. The read pointer is progressed (i.e., advanced) based on the processing speed of the corresponding B-FSM, so that the plurality of B-FSMs operate independently of one another. The processing speed of each B-FSM engine will vary over time, for example due to the type of memory accesses (e.g., fast default rule access in SRAM versus regular rule access to eDRAM cluster column) or due to different contention occurring at the TSV, cluster column or individual eDRAM bank level.

Because the input buffer has a limited size in practice, and also needs to be updated with new (consecutive) data from the input stream when it has been completely processed, there is a limit on the maximum distance that can occur between any two read pointers (in particular, the read pointers corresponding to the slowest and fastest B-FSM engines at any given moment). If this prescribed limit, which is preferably a function of the input buffer size, is exceeded, then the fastest B-FSM engine will be put temporarily in a hold state until the slowest B-FSM engine has progressed enough data that the maximum distance between the two read pointers has been reduced to within the prescribed limit.

Figure 5A:
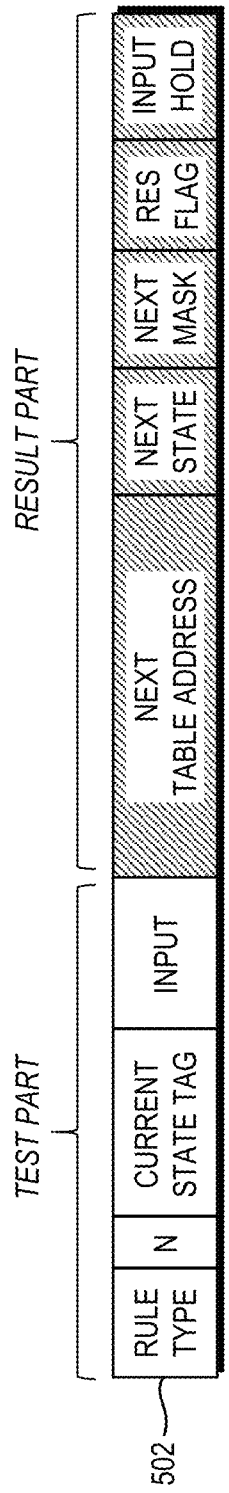
FIGS. 5(a) and 5(b) are illustrations of transition rule vector definitions, according to embodiments of the invention.
Figure 5B:
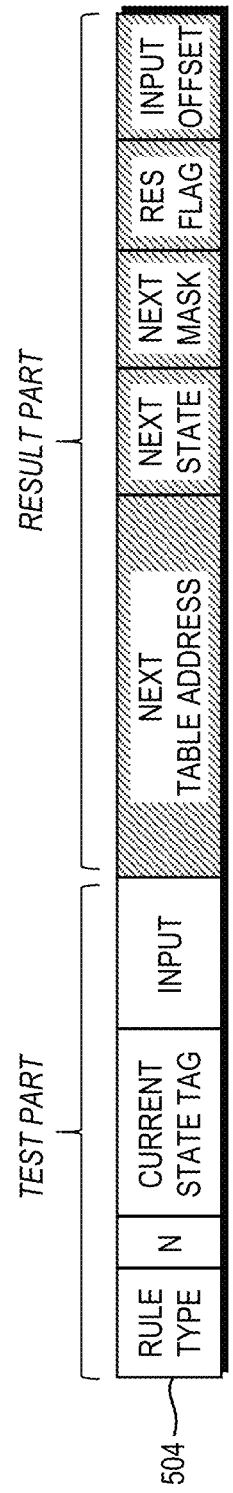

The independent read pointer control per B-FSM engine enables an extension of each B-FSM with additional functionality to provide explicit control over the read pointer. The standard approach is that the read pointer is advanced to the next input byte after each state transition step. FIG. 5(*a*) conceptually depicts an illustrative transition-rule vector definition 502, according to an embodiment of the invention. The transition-rule vector definition 502 is comprised of a test part, including "rule type," negate "N," "Current State Tag," and "Input" data fields, and a rule part, including "Next Table Address," "Next State," "Next Mask," and "Res Flag" data fields. For an explanation of these fields, see, for example, Van Lunteren 2009 and Van Lunteren 2006, referenced above. The rule part of the transition-rule vector definition 502 further includes an "Input Hold" data field. If this "Input Hold" flag is set in the transition rule vector 502 that a B-FSM has just executed, then the read pointer will remain at the same input byte which will be processed again in the next cycle. A key advantage of this approach is that it allows the scanner to overcome a limitation of the original concept; namely, that there can only be one LRP instruction attached to a given state transition. By setting the "Input Hold" flag in this transition and introducing a sequence of "intermediate" states and transitions with input conditions that will always match the given input byte, any number of extra instructions can be executed by attaching those to the "intermediate" transition rules. This comes at the cost of a temporarily lower B-FSM processing rate. Another advantage would be that it allows the scanner to divide transition rules of one state that cannot be mapped in a storage-efficient fashion, over multiple "derived" states that can be mapped in a more compact manner. The compiler performs a trade-off between storage efficiency and scan rate in this exemplary case.

FIG. 5(*b*) conceptually depicts an illustrative transition-rule vector definition 504 which is a variation of the rule vector 502 shown in FIG. 5(*a*), according to an embodiment of the invention. In transition-rule vector definition 504, all of the data fields are essentially the same as in the transition-rule vector 502 shown in FIG. 5(*a*), except that the "Input Hold" flag is replaced by an "Input Offset" data field. This "Input Offset" field is used, in one or more embodiments, to define an offset, which can be negative or positive based on whether the read pointer will be moved backwards or forwards, respectively.

Allowing an offset to be added to the read pointer would, for example, support a more efficient detection of a given pattern or patterns. By way of illustration only and without limitation, consider the pattern mask "a....bc" which will match any string in the input stream that starts with an 'a,' followed by four characters that can be of any type, followed by a prescribed two-character string "bc." While this type of pattern can cause a storage explosion as described above using an approach in which the bytes in the input stream are processed in sequential order, now the B-FSM is able to check first for a match on "bc" and then test if there was an 'a' seven characters before by temporarily moving the read pointer backwards using a negative offset in the "Input Offset" data field. When matching many patterns in parallel, this methodology requires a sophisticated compiler to exploit this feature efficiently, with the tradeoff being a highly efficient pattern-matching methodology.

Because the read pointer of each B-FSM is also part of the scan session state for a given data stream, it also has to be stored as part of that session state when switching to a different data stream as part of the multi-session support (i.e., interleaved processing of multiple active streams). Alternatively, before making a session switch, all B-FSMs in a given session could be allowed to proceed to a certain position in the input stream, resulting in all read pointers having the same value which only needs to be stored (and retrieved) once as part of the session state, rather than storing a separate read pointer value for each B-FSM engine.

LRP Instruction Synchronization

Because the B-FSMs process the input stream in a relatively independent fashion at varying speeds, only limited by constraints imposed by the buffer size as previously described, this results in a variable timing of the dispatching of LRP instructions by different B-FSM engines that cannot be predicted in advance. If two LRP instructions dispatched by separate B-FSM engines operate on the same LRP bits, then this can result in race conditions that can be resolved by an instruction synchronization mechanism to ensure correct operation of the LRP. This instruction synchronization feature, which may be implemented in the synchronization module 420 (FIG. 4), will now be illustrated using the example of the pattern "ab.*cd" that was previously discussed in conjunction with FIG. 1(c) to illustrate the handling of the state explosion problem.

Referring again to FIG. 1(c), the set instruction attached to the transition from state S1 to S9, and the test instruction attached to the transition from state S2 to S11, operate on the same bit 7 in a given LRP register. In this example, both instructions were integrated into the same DFA that was executed by a single B-FSM engine. Consequently, if the input data stream would contain a string ab later followed by a string cd, then the set and test instructions on bit 7 would be dispatched and executed in exactly the same order that the strings ab and cd occur in the input data stream. If, however, the scanning for the string ab and the corresponding set instruction is compiled on a different DFA/B-FSM engine than the scan operation for the string cd with the associated test instruction, then it is not guaranteed that the set and test instructions occur in the same order as the detection of the strings ab and cd in the input data stream, due at least in part to the varying scan rates of the independently operating B-FSM engines.

For example, if the input data stream contains a string abcd and the B-FSM engine upon which the scanning for cd is mapped is scanning the input data stream five characters in advance compared to the B-FSM engine scanning for ac, then a test instruction will first be dispatched and executed followed by a set instruction. Because of this order, in this case the test instruction will not find bit 7 to be set (that happens later), and no match is reported for the original pattern ab.*cd, which results in an incorrect scan operation failing to detect an actual match. To resolve this described type of race condition and guarantee a correct local result processing, a synchronization mechanism is preferably applied that operates in the following manner, according to one or more embodiments.

First, all LRP instructions that are dispatched by the B-FSM engines, are tagged with the offset of the current input byte within the input data stream. Because of the limited size of the input buffer, this offset can be limited to a certain number of least significant bits and/or the read pointer, which should still have the property that the corresponding values are ordered by the occurrence of the input bytes within the input data stream.

Next, as part of the dispatcher function (or, alternatively, a pre- or post-processing function to the dispatcher), a synchronization of these instructions is done such that all instructions are only dispatched and executed in the same order as defined by the offset tags. The synchronization is implemented as a "reordering"/queuing function that takes into account the byte offset at which the B-FSM engine that is the slowest at a given moment in processing the given input stream, and only dispatches instructions whose tags equal that byte offset, while the remaining instructions are kept in the instruction queue.

Because not all instructions are subject to race conditions (e.g., if the set and test instructions in the above example were mapped on the same DFA, then no race condition would occur) and consequently do not all need synchronization, this is exploited to improve the efficiency of the synchronization function; in particular, an effective use of the synchronization queue. This is done, in one or more embodiments, by a special bit flag as part of the instruction vector or by using a special reserved tag value for those instructions that the compiler can use to indicate whether or not a given instruction is subject to race conditions, and thereby determine whether LRP instruction synchronization is required.

Because the instruction queue that is used for performing the synchronization has a limited size, any B-FSM engine that tries to dispatch a new LRP instruction (requiring synchronization) that will result in reaching either an overall defined threshold or a per B-FSM engine defined threshold will be put into a hold state, until the fill rate of the queue has been sufficiently reduced through the dispatch of LRP instructions out of the queue, such that the threshold values are not exceeded, and new instructions can be accepted into the instruction queue.

New Distributed LRP Concept Based on Multiple MPUs

Figure 6:
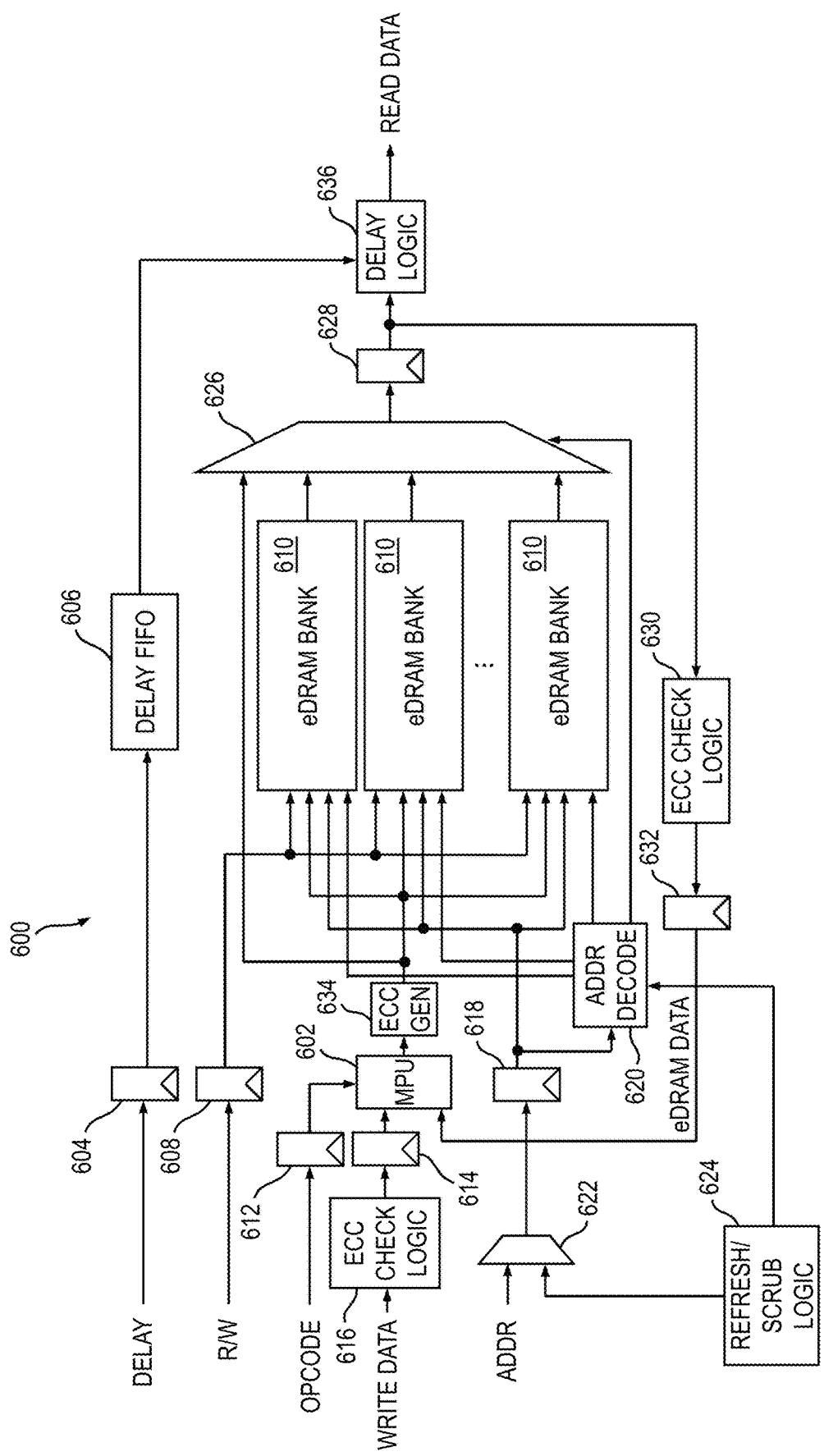
FIG. 6 is a block diagram of a memory processor unit (MPU) integrated into an embedded dynamic random-access memory (eDRAM) cluster controller, according to an embodiment of the invention.

A distributed local result processor (DLRP), according to one or more embodiments of the invention, is based on the novel concept of a dispatch function and a match report function at the FPGA logic layer and multiple distributed MPUs (memory processor units) integrated into the eDRAM cluster controllers at the eDRAM array layers, as was illustrated in FIGS. 2, 3 and 4. FIG. 6 shows a more detailed block diagram of at least a portion of an exemplary control circuit 600 comprising an MPU 602 integrated into an eDRAM cluster controller, according to one or more embodiments.

With reference to FIG. 6, the control circuit 600 includes a first latch 604, which may be implemented, for example, by a D-type flip-flop (DFF) or the like, adapted to receive a delay input signal (DELAY) presented to the circuit and operative to generate a latched delay signal as an output thereof which is supplied to a delay first-in first-out (FIFO) register 606. A second latch 608 is adapted to receive a read/write input control signal (R/W) presented to the circuit 600 and is operative to generate a latched read/write signal as an output thereof which is supplied to each of a plurality of eDRAM banks 610. A third latch 612 is adapted to receive an operation code input signal (OPCODE) presented to the circuit 600 and is operative to generate a latched opcode signal as an output thereof which is supplied to the MPU 602.

A fourth latch 614 is adapted to receive write input data presented to the circuit 600, which has been passed through a first error correction code (ECC) check logic 616, and is operative to generate a latched write data signal as an output thereof which is supplied to the MPU 602. A fifth latch 618 is adapted to receive an input address (ADDR) presented to the circuit 600 and is operative to generate a latched input address signal as an output thereof which is supplied to an address decoder 620 and to the eDRAM banks 610. The address decoder 620 is configured to generate one or more control signals supplied to the eDRAM banks 610 as a function of the input address. The input address is supplied to a first multiplexer 622 which is operative to receive an input address or an address generated by refresh/scrub logic 624 for periodically refreshing the data stored in the eDRAM banks 610.

A second multiplexer 626 is configured to receive data from each of the eDRAM banks 610 and to generate an output data signal indicative of a given one of the selected banks as a function of the one or more control signals generated by the address decoder 620. The eDRAM data read from the selected one of the eDRAM banks 610 is latched by a sixth latch 628. The latched read data is supplied to a second ECC check logic 630 which generates the eDRAM data. This eDRAM data is latched by a seventh latch 632 before being supplied to the MPU 602. Data generated by the MPU 602 is passed through an ECC generator 634 which appends prescribed data correction bits to the input data to generate encoded data supplied to the eDRAM banks 610 and to the multiplexer 626.

A delay logic module 636 included in the controller circuit 600 is configured to delay the data read from the eDRAM banks 610 and latched by latch 628 and to generate a delayed data signal, READ DATA, output by the controller circuit. The amount of delay generated by the delay logic module 636 is programmable, in one or more embodiments, as a function of the delay signal stored in the delay FIFO register 606 and supplied to the delay logic module.

The dispatcher function at the FPGA logic layer (see FIG. 3) will receive LRP instructions from the corresponding B-FSM engines, which it will convert using an optional recoding step into MPU instruction vectors that it will send to the appropriate MPU located in one of the eDRAM cluster controllers in an eDRAM array layer, over the cluster column interface (see above). For each active scanning session that processes a given input data stream, a separate LRP data vector is allocated within an eDRAM cluster column. This vector can be relatively large, for example, up to 1 Mbit. The base offset of this data vector is stored inside the dispatch unit, which will use it to send the LRP instructions for that session to the right MPUs. This base offset is part of the session state and will be stored and retrieved when the scanner switches between different input streams. The LRP data vector is also part of the session state; it only needs to be stored in and retrieved from off-chip memory upon session switching when storage capacity limitations force this.

Multiple B-FSM engines can send LRP instructions to the same MPU in parallel, in one or more embodiments. Those LRP instructions are attached to transitions that are part of the compiled B-FSM structure stored in the eDRAM cluster columns and are executed by those B-FSM engines. In addition, multiple default instructions can also be sent upon the occurrence of selected characters or short character sequences in the input stream. These default instructions are stored in the SRAM in the FPGA logic layer, and are selected using a relatively simple lookup on the input bytes. The dispatcher will schedule the transfer of those instructions over the cluster column interface (also performing a synchronization, if needed, as described above).

For reporting the detection of a matching character string in the input data stream, a match report function is used which, in one or more embodiments, is implemented at the FPGA logic layer. A first type of matches are those that are reported directly by the B-FSM engines and which involve the "conventional" approach in which the DFA arrives at a particular state that corresponds to the detection of a certain pattern in the input stream—for this type of match, the transition rules that have been executed contain a result flag that is set to one (FIG. 5 shows this flag as part of the transition rule vector, although alternative arrangements are contemplated by embodiments of the invention). In this case, the match report logic will use the target state of the latter transition, that is defined by a B-FSM identifier (ID), table address, and state vector, to compose a match report that is sent to the search application and which identifies the pattern or patterns that were found to be matching. The match report also contains the offset of the last character of the matching string that was found within the input data stream.

A second type of match report involves matches that are reported by the LRP. For example, a match for the pattern ab.*cd will be reported in the above described example corresponding to FIG. 1(*c*), if the test operation on bit 7 (e.g., attached to the transition from state S2 to S11) has a positive result. For this type of match, a special set of match report instructions is available that are dispatched to and executed by the MPU and typically involve the testing of one or multiple bits in an LRP data vector. The test result is then returned to the match report logic function, which already received the B-FSM identifier/table address/state vector information from the B-FSM that dispatched the match report instruction. Upon a positive test, a match report will be created that includes all this information and will be forwarded to the search application, according to one or more embodiments.

There are various match report instructions defined. Some of these match report instructions allow the inclusion of selected portions of the LRP data vector into the match report which can be used for further post-processing (e.g., in software). An important aspect of the present disclosure is the way in which a match report instruction is executed and, in particular, the flow of data towards the match report logic module 340 (FIG. 3) to create a match report output. This also includes the tagging of information directly provided to the match report logic module by the B-FSM engine that dispatched the match report instruction and the association of information returned by the MPU that executed this match report instruction, in order to combine these two types of information into one match report.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 7:
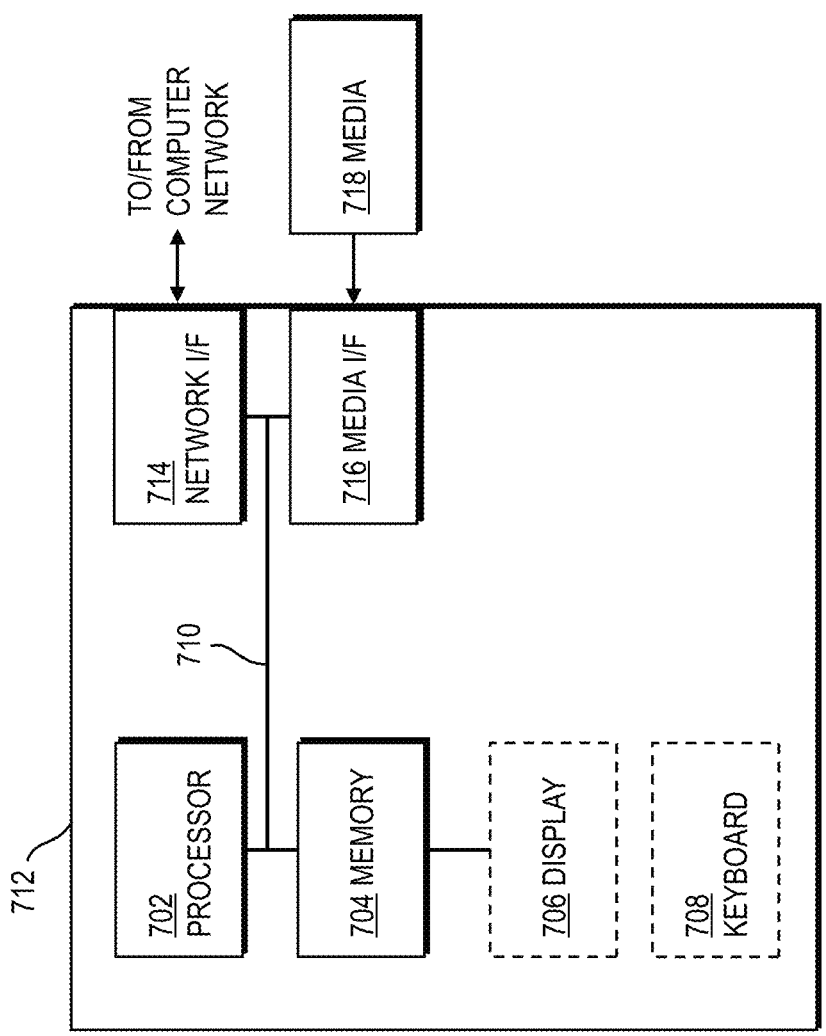
FIG. 7 is a block diagram depicting at least a portion of an exemplary computer system that may be useful in implementing one or more embodiments and/or elements of the invention.

One or more embodiments can make use of software running on a general purpose computer or workstation. With reference to FIG. 7, such an implementation might employ, for example, a processor 702, a memory 704, and an input/output interface formed, for example, by a display 706 and a keyboard 708. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 702, memory 704, and input/output interface such as display 706 and keyboard 708 can be interconnected, for example, via bus 710 as part of a data processing unit 712. Suitable interconnections, for example via bus 710, can also be provided to a network interface 714, such as a network card, which can be provided to interface with a computer network, and to a media interface 716, such as a diskette or CD-ROM drive, which can be provided to interface with media 718.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 702 coupled directly or indirectly to memory elements 704 through a system bus 710. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 708, displays 706, pointing devices, and the like) can be coupled to the system either directly (such as via bus 710) or through intervening I/O controllers (omitted for clarity).

Network adapters such as network interface 714 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 712 as shown in FIG. 7) running a server program. It will be understood that such a physical server may or may not include a display and keyboard.

As noted, aspects of the present invention may take the form of a computer program product embodied in one or more computer readable medium(s) having non-transitory computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 718 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with non-transitory computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Non-transitory program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a memory health tracking module, and a duplication module. The method steps can then be carried out using the distinct software modules and/or sub-modules of the system, as described above, executing on one or more hardware processors 702. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuits (ASICs), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for performing pattern scanning, comprising:
providing a three-dimensional memory structure including a plurality of physical memory elements, the three-dimensional memory structure comprising a plurality of embedded dynamic random-access memory array layers, a logic layer configured over the plurality of embedded dynamic random-access memory array layers, and a fabric layer with input/output macros and high-speed communication links, the fabric layer disposed between the logic layer and the plurality of embedded dynamic random-access memory array layers, each embedded dynamic random-access memory array layer comprising a two-dimensional array of embedded dynamic random-access memory clusters, each embedded dynamic random-access memory cluster comprising one or more embedded dynamic random-access memory blocks and each embedded dynamic random-access memory cluster having its own corresponding cluster controller so that there is a one-to-one correspondence between each embedded dynamic random access memory cluster and a corresponding cluster controller, each cluster controller having a memory processor unit therewithin for increasing local processing speed and reducing bandwidth, with a plurality of said embedded dynamic random-access memory clusters being vertically linked together by through-silicon vias over said plurality of said embedded dynamic random-access memory array layers to form a cluster column;
providing at least one deterministic finite automation data structure with integrated instructions that are distributed over the logic layer, each cluster column corresponding to a portion of the logic layer;
compiling a plurality of programmable finite state machines, each of the programmable finite state machines representing at least one of the at least one deterministic finite automation data structure, the at least one deterministic finite automation data structure being distributed over at least a subset of said plurality of physical memory elements;
configuring a subset of the programmable finite state machines to operate in parallel on a same input data stream, while each of said subset of programmable finite state machines processes a different pattern subset; and
providing a local result processor, the local result processor transferring at least a part of a match state from said at least one deterministic finite automation data structure to corresponding registers within said local result processor, said part of the match state being manipulated based on instructions embedded within the at least one deterministic finite automation data structure.

2. The method of claim 1, wherein said plurality of physical memory elements are interconnected together using the through-silicon vias.

3. The method of claim 1, further comprising implementing said local result processor in a distributed manner using smaller processing elements that are integrated into said three-dimensional memory structure, each of at least a subset of the smaller processing elements being configured for executing local result processor instructions dispatched by said plurality of programmable finite state machines.

4. The method of claim 3, further comprising configuring said local result processor such that each of at least a subset of the smaller processing elements operates on local result processor data vectors corresponding to a different active data stream.

5. The method of claim 3, further comprising:
providing an instruction dispatcher module;
encoding local result processor instructions integrated into said at least one deterministic finite automation data structure to an available instruction vector width and supported subset of instructions corresponding to the smaller processing elements; and
recoding, by said instruction dispatcher module, instruction vectors processed by said local result processor so that the instruction vectors are adapted to fit a transfer data unit over said through-silicon vias to the distributed smaller processing elements.

6. The method of claim 1, further comprising configuring each of said plurality of programmable finite state machines to operate independently of one another on said same input data stream.

7. The method of claim 1, further comprising:
providing at least one input buffer configured to store data received from a corresponding input data stream;
providing a plurality of read pointers to the at least one input buffer and controlling each of the read pointers by a corresponding one of the plurality of programmable finite state machines operating on said same input data stream, such that each of said plurality of programmable finite state machines operate independently of one another on said same input data stream.

8. The method of claim 1, further comprising synchronizing at least two instructions dispatched by separate corresponding programmable finite state machines operating on local result processor data so that instructions are dispatched and executed by the programmable finite state machines in a same order as defined by offset tags corresponding to input values for which said instructions were dispatched.

9. The method of claim 1, further comprising supporting a plurality of active scan sessions processed on different input data streams in an interleaved fashion by storing and retrieving a session state corresponding to each of said plurality of active scan sessions on different input data streams, said session state being stored in a corresponding one of the plurality of physical memory elements.

10. The method of claim 9, wherein said storing and retrieving session states corresponding to the plurality of active scan sessions comprises:
allowing a subset of the programmable finite state machines in a given active scan session to proceed to a prescribed position in a corresponding input data stream which said subset of the programmable finite state machines are processing, thereby ensuring that read pointers corresponding to the subset of the programmable finite state machines have a same value; and
storing and retrieving said value for the read pointers as part of the session state for the given active scan session.

11. A pattern scanning apparatus, comprising:
a three-dimensional memory structure including a plurality of physical memory elements, the three-dimensional memory structure comprising a plurality of embedded dynamic random-access memory array layers, a logic layer configured over the plurality of embedded dynamic random-access memory array layers, and a fabric layer with input/output macros and high-speed communication links, the fabric layer disposed between the logic layer and the plurality of embedded dynamic random-access memory array layers, each embedded dynamic random-access memory array layer comprising a two-dimensional array of embedded dynamic random-access memory clusters, each embedded dynamic random-access memory cluster comprising one or more embedded dynamic random-access memory blocks and each embedded dynamic random-access memory cluster having its own corresponding cluster controller so that there is a one-to-one correspondence between each embedded dynamic random access memory cluster and a corresponding cluster controller, each cluster controller having a memory processor unit therewithin for increasing local processing speed and reducing bandwidth, with a plurality of said embedded dynamic random-access memory clusters being vertically linked together by through-silicon vias over said plurality of said embedded dynamic random-access memory array layers to form a cluster column;
at least one deterministic finite automation data structure with integrated instructions that are distributed over the logic layer, each cluster column corresponding to a portion of the logic layer;
a plurality of programmable finite state machines, each of the programmable finite state machines being adapted to receive an input data stream and representing at least one deterministic finite automation data structure, the at least one deterministic finite automation data structure being distributed across at least a subset of said plurality of physical memory elements; and
at least one local result processor, the local result processor comprising a plurality of processing units distributed across at least the subset of said plurality of physical memory elements, the at least one local result processor being configured to transfer at least a part of a match state from said at least one deterministic finite automation data structure to corresponding registers within said local result processor, said part of the match state being manipulated based on instructions embedded within the at least one deterministic finite automation data structure.

12. The apparatus of claim 11, wherein said plurality of physical memory elements are interconnected together using the through-silicon vias.

13. The apparatus of claim 11, further comprising an instruction dispatcher module operatively coupled with the three-dimensional memory structure and said plurality of programmable finite state machines, the instruction dispatcher module being configured to receive instructions from at least a subset of the programmable finite state machines and to forward said instructions to the three-dimensional memory structure using prescribed types of memory accesses.

14. The apparatus of claim 13, wherein the instruction dispatcher module is further configured to encode local result processor instruction vectors attached to transitions in said plurality of programmable finite state machines, to thereby fit available instruction vector widths in a corresponding data structure, and to recode said local result processor instruction vectors into a format that fits a transfer size and execution of the instruction vectors over said through silicon vias.

15. The apparatus of claim 11, wherein the apparatus is configured to associate an offset tag with each of at least a subset of local result processor instructions dispatched by the programmable finite state machines, said offset tag indicating a position of a current input byte within the input data stream, the apparatus further comprising a synchronization module configured to synchronize at least two instructions dispatched by separate corresponding programmable finite state machines operating on same local result processor data so that instructions are dispatched and executed by the programmable finite state machines in a same order as defined by an offset tag corresponding to said instructions being synchronized.

16. The apparatus of claim 11, further comprising at least one controller operatively coupled with said three-dimensional memory structure, the controller being configured to support a plurality of active scan sessions processed on different input data streams in an interleaved fashion by storing and retrieving a session state corresponding to each of said plurality of active scan sessions on different input data streams, said session state being stored in a corresponding one of the plurality of physical memory elements.

17. The apparatus of claim 16, wherein said session state comprises at least one of a state of each of the plurality of programmable finite state machines utilized in a given scan operation, a read pointer associated with each of the plurality of programmable finite state machines, and a local result processor data vector corresponding to a given scan session, the data vector including a pointer in an instruction dispatcher module configured to direct instructions to a prescribed memory controller associated with a corresponding one of the physical memory elements.

18. A pattern scanning apparatus, comprising:
a three-dimensional memory structure including a plurality of physical memory elements, the three-dimensional memory structure comprising a plurality of embedded dynamic random-access memory array layers, a logic layer configured over the plurality of embedded dynamic random-access memory array layers, and a fabric layer with input/output macros and high-speed communication links, the fabric layer disposed between the logic layer and the plurality of embedded dynamic random-access memory array layers, each embedded dynamic random-access memory array layer comprising a two-dimensional array of embedded dynamic random-access memory clusters, each embedded dynamic random-access memory cluster comprising one or more embedded dynamic random-access memory blocks and each embedded dynamic random-access memory cluster having its own corresponding cluster controller so that there is a one-to-one correspondence between each embedded dynamic random access memory cluster and a corresponding cluster controller, each cluster controller having a memory processor unit therewithin for increasing local processing speed and reducing bandwidth, with a plurality of said embedded dynamic random-access memory clusters being vertically linked together by through-silicon vias over said plurality of said embedded dynamic random-access memory array layers to form a cluster column;
at least one deterministic finite automation data structure with integrated instructions that are distributed over the logic layer, each cluster column corresponding to a portion of the logic layer; and
the apparatus configured:
to compile a plurality of programmable finite state machines, at least one of the programmable finite state machines representing the at least one deterministic finite automation data structure;
to configure a subset of the programmable finite state machines to operate in parallel on a same input data stream, while each of said subset of programmable finite state machines processes a different pattern subset; and
to transfer at least a part of a match state from said at least one deterministic finite automation data structure to corresponding registers within said apparatus, said part of the match state being manipulated based on instructions embedded within the at least one deterministic finite automation data structure.

* * * * *